(12) United States Patent
Tonosaki et al.

(10) Patent No.: US 6,783,644 B2
(45) Date of Patent: Aug. 31, 2004

(54) FILM DEPOSITION METHOD

(75) Inventors: Minehiro Tonosaki, Kanagawa (JP); Koji Kitagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/311,614

(22) PCT Filed: Apr. 23, 2002

(86) PCT No.: PCT/JP02/04012

§ 371 (c)(1),
(2), (4) Date: Dec. 17, 2002

(87) PCT Pub. No.: WO02/088415

PCT Pub. Date: Jul. 11, 2002

(65) Prior Publication Data

US 2003/0198752 A1 Oct. 23, 2003

(51) Int. Cl.$^7$ ............................. C23C 14/32; B05D 1/36
(52) U.S. Cl. ................. 204/192.38; 427/502; 427/523; 427/580
(58) Field of Search ................................ 427/523, 580, 427/402; 204/192.38

(56) References Cited

U.S. PATENT DOCUMENTS

| | | |
|---|---|---|
| 4,603,082 A | 7/1986 | Zelez ......................... 428/306 |
| 5,587,210 A * | 12/1996 | Marchywka et al. ........ 427/523 |
| 5,837,357 A * | 11/1998 | Matsuo et al. ............... 428/212 |

FOREIGN PATENT DOCUMENTS

| | | | |
|---|---|---|---|
| EP | 969118 | 1/2000 | ........... C23C/14/48 |
| GB | 2342660 | 4/2000 | ........... C23C/14/58 |
| JP | 200-021019 | 1/2000 | ............ G11B/7/24 |
| JP | 200-119844 | 4/2000 | ........... C23C/14/06 |
| JP | 2000-345322 | 12/2000 | ........... C23C/14/22 |

OTHER PUBLICATIONS

Kazuhisa Miyoshi, *Friction and Wear Properties of As–Deposited and Carbon Ion–Implanted Diamond Films*, Mater. Sci. Eng. A, 1996, vol. A209, Nos. 1 to 2, pp. 38–53.

* cited by examiner

*Primary Examiner*—Steven Versteeg
(74) *Attorney, Agent, or Firm*—Sonnenschein, Nath & Rosenthal LLP

(57) ABSTRACT

A film deposition method, which can form a high quality functional thin film excellent in various physical properties on a surface such as a plastic substrate, is provided. A carbon precursor film is formed on the surface of the substrate K with carbon ions (N2A) using a processing source (4) (a FCVA ion source) with no voltage applied to the substrate K, and then carbon ions (N2B) are implanted in the carbon precursor film with a pulsed voltage containing a negative pulse voltage of –15 kV or less applied to the substrate K, in order to form the carbon thin film. The quality of the carbon precursor film is improved and the various physical properties of the carbon thin film can be controlled.

8 Claims, 13 Drawing Sheets

FILM DEPOSITION METHOD

TECHNICAL FIELD

The present invention relates to a film deposition method for forming a carbon thin film on a surface such as a plastic substrate.

BACKGROUND ART

Conventionally, functional thin films excellent in various physical properties such as a refractive index and conductivity, attracts attention as components of various devices. An example of these functional thin films is a carbon thin film with electric conductive properties which are improved by implanting nitrogen ions with an ion implantation. The carbon thin film has an advantage of being easily formed because existing ion implantation procedures can be utilized for forming the carbon thin film, but it has a disadvantage of difficulty in controlling physical properties of the carbon thin film for providing desired performances, due to reactivity of the carbon thin film to the nitrogen ions.

In recent years, functional thin films with more various physical properties and high quality are demanded to correspond to progresses of various devices. However, in conventional methods of forming the carbon thin film using the existing ion implantation, it is difficult to secure more various physical properties and to improve the quality of the carbon thin film due to the above disadvantages of controlling the physical properties, which are problems.

The present invention has been achieved in view of the above problems. It is an object of the invention to provide a film deposition method which allows a high-quality functional thin film, which is excellent in various physical properties, to be formed on a surface such as a plastic substrate.

DISCLOSURE OF THE INVENTION

A film deposition method of the invention is a method of forming a carbon thin film on a surface of a processing object, comprises a first step of generating first carbon ions and forming a carbon precursor film on the surface of the processing object with the first carbon ions, with no voltage applied to the processing object, and a second step of generating second carbon ions and implanting the second carbon ions in the carbon precursor film, with a pulsed voltage containing a negative pulse voltage applied to the processing object, wherein both of the first carbon ions and the second carbon ions are generated by evaporating a cathode containing carbon using energy of arc discharges.

According to the film deposition method of the invention, first, the carbon precursor film is formed on the surface of the processing object using the first carbon ions with no voltage applied to the processing object, in the first step. Then, in the second step, the second carbon ions are implanted in the carbon precursor film with the pulsed voltage containing the negative pulse voltage which is applied to the processing object. Both of the first carbon ions and the second carbon ions are generated by evaporating the cathode containing carbon with the energy of the arc discharges. Thereby, the high-quality carbon thin film having the various physical properties such as a refractive index, conductivity, and hardness is formed on the surface of the processing object.

BEST MODE FOR CARRYING OUT THE INVENTION

Embodiments of the present invention will be described in detail below with reference to accompanying drawings.

[First Embodiment]

Figure 1:
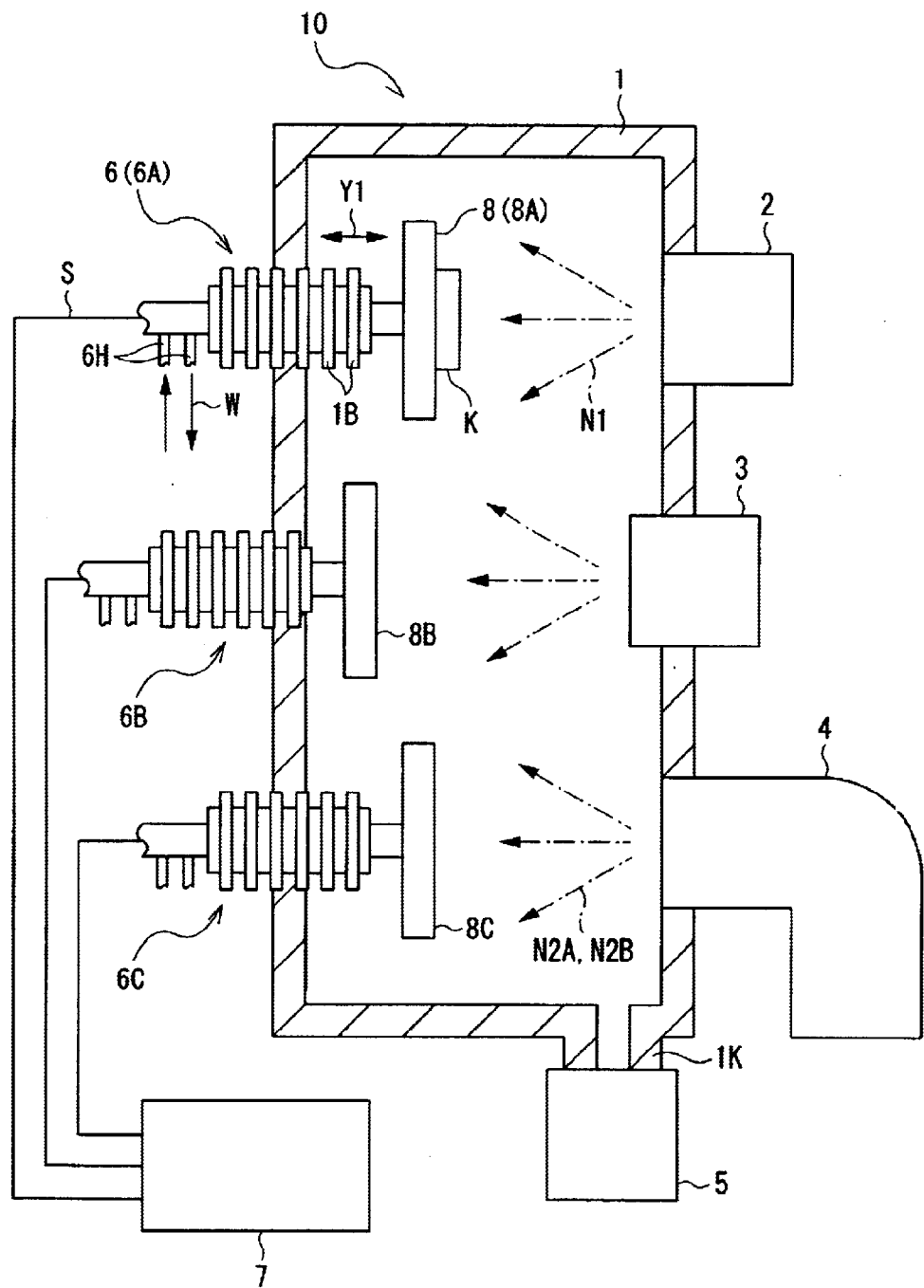
FIG. 1 is a view showing an example of a configuration of a film deposition apparatus for being used in the film deposition method according to a first embodiment of the invention.

First, a film deposition method according to the first embodiment of the invention will be explained. FIG. 1 shows an example of configuration of a film deposition apparatus being used for the film deposition method according to the embodiment. The film deposition apparatus forms a carbon thin film, which is a functional thin film excellent in various physical properties such as a refractive index, conductivity, and hardness, on a surface of a plastic substrate.

<1. Configuration of a Film Deposition Apparatus>

The film deposition apparatus 10 comprises a vacuum chamber 1 made of a metal or the like, plurality of processing sources (three, for example) 2, 3, and 4 disposed on a wall surface of the vacuum chamber 1, a vacuum pump 5 being connected to the vacuum chamber 1 through an exhaust pipe 1K, plurality of (three, for example) lead terminals 6 (6A, 6B, 6C) which are disposed respectively corresponding to the processing sources 2–4 and have one end extending to the inside of the vacuum chamber 1, and a bias power supply 7 which is connected to the lead terminals 6 through a wiring S and applies bias voltages to the lead terminals 6. The one ends of the lead terminals 6A–6C are respectively connected to plurality of (three, for example) substrate holders 8 (8A, 8B, 8C), and a substrate K which is an object to be processed (processing object) is mounted on these substrate holders 8. The substrate K can be moved at any time among the substrate holders 8A–8C with a moving arm which is not shown. Here, FIG. 1 shows a case where the substrate K is mounted on the substrate holder 8A.

The processing source 2 is composed of a Kaufman ion source, for example, and mainly performs cleaning a surface of the substrate K (being called "cleaning process" hereinafter). The processing source 2 uses a gas (cleaning gas) which can produce ions (cleaning ions) which are required in the cleaning process to generate plasma containing the cleaning ions in the vacuum chamber 1. Cleaning gases can include inert gases such as argon (Ar).

The processing source 3 is composed of a DC (Direct Current) sputtering source, for example, and forms mainly an adherent film, which bonds the carbon thin film formed by the processing source 4 to the substrate K, on a surface of the substrate K or the like.

The processing source 4 is composed of a FCVA (Filtered Cathodic Vacuum Arc) ion source, for example, and mainly performs both of a film deposition process of forming a thin film on the surface of the substrate K and an ion implantation process of implanting ions in the thin film. Determining which process of the processing source 4 (the film deposition process or the ion implantation process) to be performed depends on conditions of applying a bias voltage to the substrate K with the bias power supply 7. The correlation between the process in the processing source 4 and the conditions of applying the bias voltage will be described later.

The FCVA ion source is a cathodic arc source, which is widely used, having an electromagnetic filter for removing droplets produced by fusion of a cathode. The processing source 4 has the cathode composed of a high-density carbon rod as an ion source, and evaporates the cathode using energy of arc discharges, which are generated by a striker trigger electrode, to generate carbon ions in the vacuum chamber 1. The carbon ions generated by the processing source 4 function as "film deposition ions (first carbon ions)" for forming the thin film during the film deposition process and as "implanted ions (second carbon ions)" for improving quality of the thin film during the ion implantation process. These carbon ions are lead onto the substrate K through two duct coils mounted in the processing source 4 to perform the film deposition process or the ion implantation process. The processing source 4 can generate the carbon ions maintaining a high-vacuum state, because no gas for generating ions is required unlike the processing source 2 (the Kaufman ion source) requiring the cleaning gas to generate the cleaning ions.

The vacuum pump 5 has a structure including a turbo molecular pump, and mainly exhausts a gas (for example, air or the like), which is filled in the vacuum chamber 1, through the exhaust pipe 1K to depressurize the vacuum chamber 1 to a desired vacuum state.

The lead terminals 6 (6A–6C) are composed of a widely used lead terminal, for example, and each of them can move in the direction shown by an arrow Y1 in the figure, based on processing conditions of the processing sources 2–4 and the like. These lead terminals 6 include, for example, a piping 6H for a refrigerant cycle and circulating the refrigerant W through the piping 6H can cool the substrate K mounted on the substrate holder 8. In addition, the lead terminals 6 are made of a conductive material such as a metal, and are supported by support members 1B which are located in the vacuum chamber 1. These support members 1B are made of an insulating material such as a ceramic, and the vacuum chamber 1 and the lead terminals 6 are separated electrically through the support members 1B.

The bias power supply 7 has a structure including, for example, a high-voltage vacuum tube circuit, and applies a pulsed voltage to the substrate K which is mounted on the substrate holder 8. Particularly, the bias power supply 7 applies no voltage to the substrate K during the film deposition process, and applies the pulsed voltage including a negative pulse voltage (−15 kV or less) and a positive pulse voltage to the substrate K during the ion implantation process. In addition, conditions of the pulsed voltage such as a pulse peak value (a pulse height), pulse rise time, pulse spacing, and a pulse width, can independently be adjusted for each of the lead terminals 6A–6C.

The substrate holders 8 (8A–8C) hold the substrate K, and are made of a conductive material such as a metal, as well as the lead terminals 6. The substrate K has a disk or rectangle structure, for example. Materials of the substrate K can include, for example, plastics such as amorphous polyolefins (APO), polymethyl methacrylate (PMMA), polycarbonate (PC), polyethylene terephthalate (PET), acrylonitrile butadiene styrene copolymer (ABS), polyacetal (POM), poly tetra fluoro ethylene (PTFE), nylon 6, polyethylene, and polyimide. In addition, materials made of an insulating material such as silicon, glass, or AlTiC ($Al_2O_3 \cdot TiC$) can also be used as the substrate K as well as the above plastics.

The film deposition apparatuses 10 comprises, for example, a microcomputer for controlling the whole film deposition apparatus 10, a gas cylinder for supplying various gases to the processing source 2 and the like, and a driving device for moving the lead terminals 6 which is connected to the other ends of the lead terminals 6 deriving from the vacuum chamber 1 to the exterior thereof, and the like, in addition to a set of the components as described above.

<2. Film Deposition Method>

Next, an example of the film deposition method according to the embodiment will be described with reference to FIGS. 1 to 6B. The case of forming a carbon thin film as a functional thin film excellent in various physical properties such as a refractive index, conductivity, hardness, and the like, on a surface of the substrate K made of a plastic will be described below.

According to the embodiment of the film deposition method, the carbon thin film is formed suitably through a cleaning step, a first film deposition step, a second film deposition step, and an ion implantation step as a main step, using the film deposition apparatus 10 shown in FIG. 1. FIGS. 2 to 5 explain the film deposition method according to the embodiment, and FIGS. 2, 3, 4, and 5 show respectively the cleaning step, the first film deposition step, the second film deposition step, and the ion implantation step. FIGS. 6A and 6B show respectively a wave form of the pulsed voltage applied to the substrate K by the bias power supply 7 (FIG. 6A) and a electric current change (FIG. 6B) in the ion implantation step. In addition, FIGS. 2 to 5 show not only a cross section structure of the substrate K and the like, but also a main structure of a principal part of the film deposition apparatus 10 (a peripheral part of the substrate K) to simply explain a series of the steps.

In order to form the carbon thin film made of the plastic on the surface of the substrate K, the following preliminary works are performed by workers or the like. That is, the substrate K (about 1 mm thickness) made of APO, PMMA, PC, or the like is cleaned first, and then the substrate K is mounted on the substrate holder 8A (refer to FIG. 2). Then, a sealing state of the vacuum chamber 1 is confirmed and a set of processing conditions (such as operating conditions of the processing sources 2–4, the vacuum pump 5, the lead terminals 6, the bias power supply 7, and the like) are inputted through an input unit such as a keyboard. Finally, while the vacuum pump 5 is operated to depressurize the vacuum chamber 1 to the desired vacuum state (for example, about $1.7 \times 10^{-4}$ Pa), the bias power supply 7 is operated to apply a pulsed voltage to the substrate holder 8. Moreover, the refrigerant W is circulated through the piping 6H, and the substrate K held by the substrate holder 8C is cooled.

<<2-1. Cleaning Step>>

Figure 2:
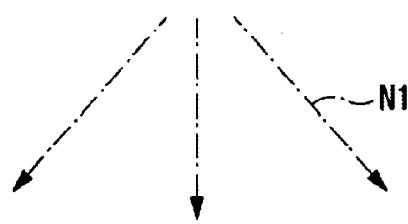
FIG. 2 is a view for explaining a cleaning step in the film deposition method according to the first embodiment of the invention.
Figure 2:
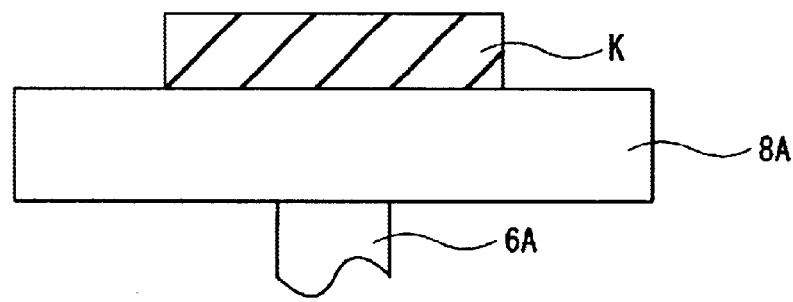

After the preliminary works are completed, the cleaning process is first performed on the substrate K by the processing source 2 (the Kaufman ion source) using an inert gas such as argon as the cleaning gas as shown in FIG. 2. In order to perform the cleaning process, an acceleration voltage of an ion beam is about 100 V and processing time is about 1 minute are used as processing conditions, for example. This generates plasma containing argon ions (the cleaning ions) N1 having energy of about 100 eV in the vacuum chamber 1 and the substrate K is exposed to the argon ions N1 in the plasma to clean the surface of the substrate K.

<<2—2. First Film Deposition Step (Step of Forming an Adherent Film)>>

Figure 3:
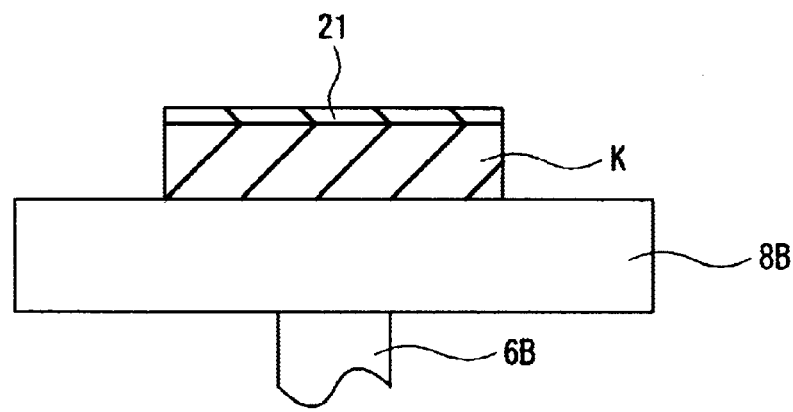
FIG. 3 is a view for explaining a first film deposition step.

Then, as shown in FIG. 3, the substrate K is moved to the substrate holder 8B by the moving arm, and then, an adherent film 21 made of amorphous silicon is formed on the surface of the substrate K having a thickness of about 5.0 nm by the processing source 3 (the DC sputtering source).

<<2-3. Second Film Deposition Step (Step of Forming a Carbon Precursor Film)>>

Figure 4:
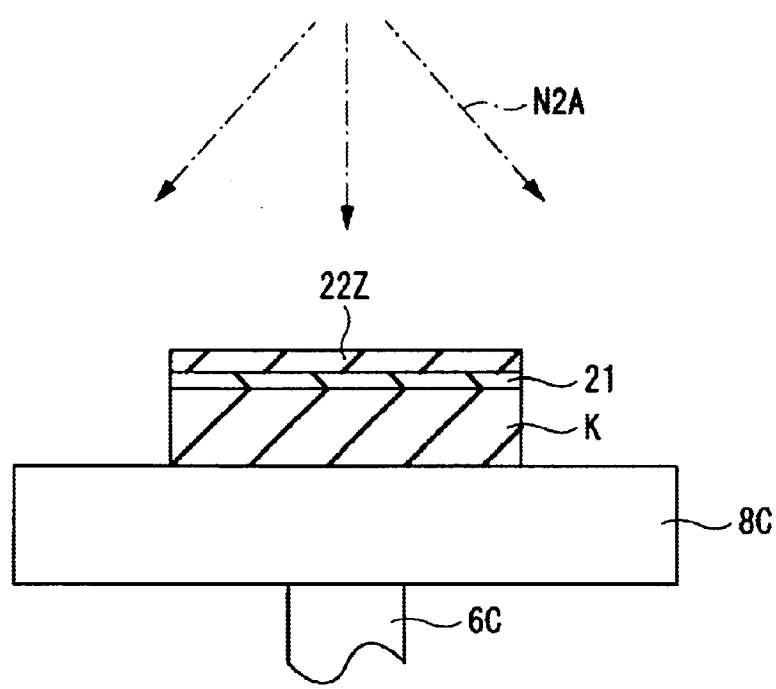
FIG. 4 is a view for explaining a second film deposition step.

Then, as shown in FIG. 4, the substrate K and the like are moved to the substrate holder 8C by the moving arm, and then, a film deposition process is performed on the surface of the substrate K by the processing source 4 (the FCVA ion source) in a condition, for example, of an operating voltage is about 25 V with no voltage applied from the bias power supply 7 to the substrate K. The carbon ions (the film deposition ions, the first carbon ions) N2A having energy of about 25 eV and an ion current of about 0.7 A are continuously generated with high density in the vacuum chamber 1, and then these first carbon ions N2A are selectively filtered in a magnetic field and are lead to the substrate K. Thereby, a carbon precursor film 22Z made of ta-C (tetrahedral amorphous Carbon) is formed on the adherent film 21. The carbon precursor film 22Z is a pre-prepared film of a carbon thin film 22 (refer to FIG. 5) which is provided by the ion implantation process in a post-process as described later.

<<2-4. Ion Implantation Step (Step of Forming the Carbon Thin Film)>>

Figure 5:
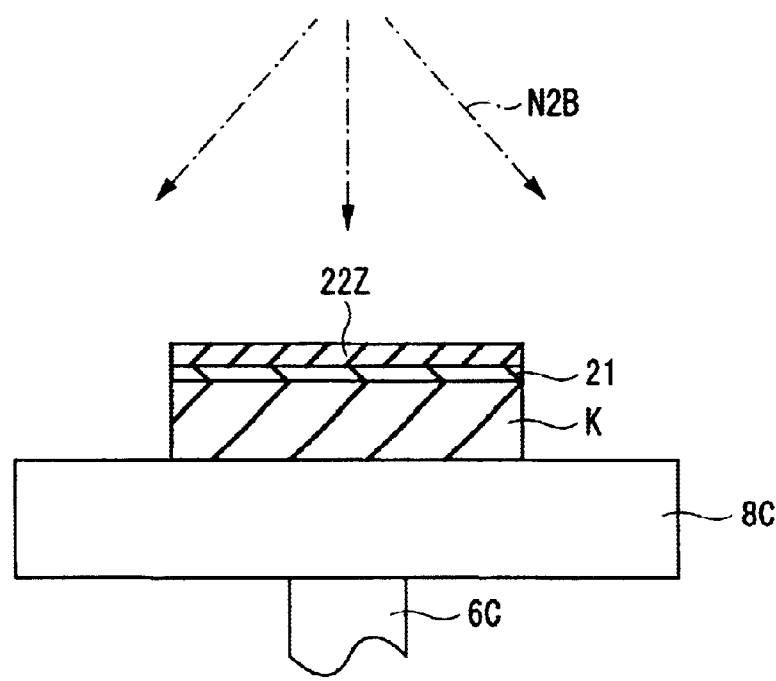
FIG. 5 is a view for explaining an ion implantation step.
Figure 6A:
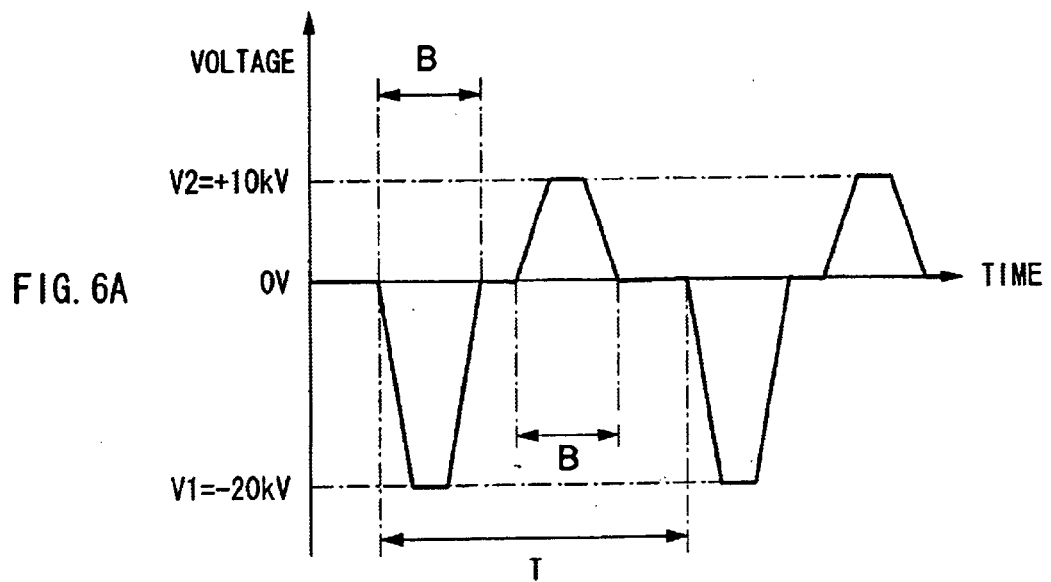
FIGS. 6A and 6B are views showing a wave form of a pulsed voltage and an electric current change in the ion implantation step.
Figure 6B:
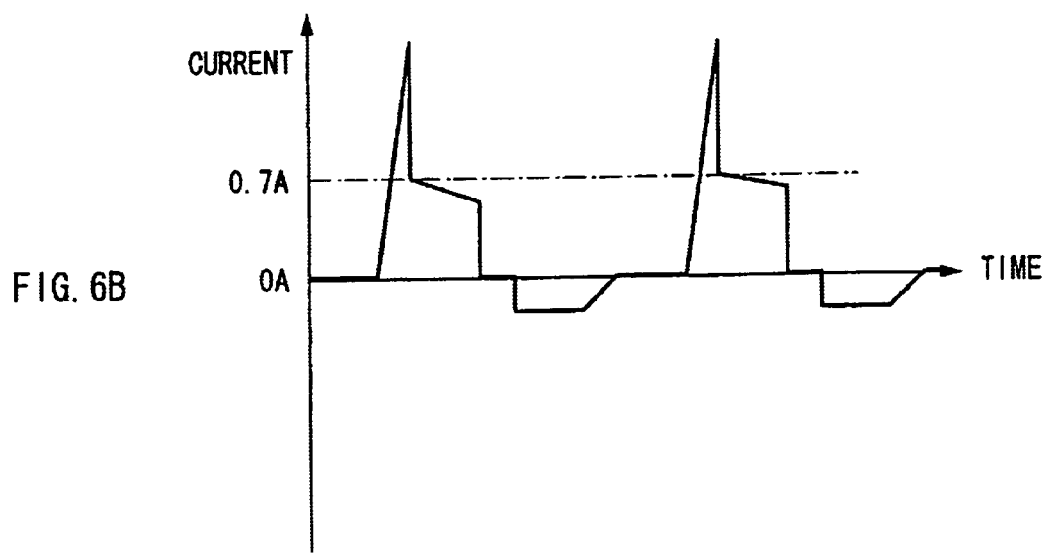

Then, as shown in FIG. 5, the ion implantation process is performed on the carbon precursor film 22Z by the processing source 4 (the FCVA ion source). For performing the ion implantation process, the bias power supply 7 applies the pulsed voltage containing the positive pulse voltage and the negative pulse voltage to the substrate K, for example, in the following conditions: a negative pulse peak value V1=about −20 kV, a positive pulse peak value V2=about +10 kV, a positive/negative pulse width B=about 60 μ seconds, and a period T=about 1 m seconds (refer to FIG. 6A). Moreover, the ion implantation process is performed with the implanted ions with an amount=about $10^{17}$ ions/cm$^2$, on electric current conditions that a peak value of an electric current generated by an ion current and secondary electrons in a bias electrode is set to about 0.7 A, when the ion current from the processing source 4 is about 0.8 A (FIG. 6B). Plasma containing the carbon ions (the implanted ions, the second carbon ions) N2B are generated in the vacuum chamber 1, and these carbon ions N2B are implanted in the carbon precursor film 22Z. This improves the quality of the carbon precursor film 22Z made of ta-C to form the carbon thin film 22 on the adherent film 21. In addition, the processing of implanting the carbon ions N2B in the carbon precursor film 22Z with the pulsed voltage being applied to the above substrate K is generally called a PBII (Plasma Based Ion Implantation).

<<2-5. Repeating Each of the Steps >>

At last, some of the steps, for example, including "the second film deposition process" and "the ion implantation process" as described above, are repeated two or more times to laminate the carbon thin film 22 and to finally obtain the carbon thin film 22 with a thickness of about 50 nm. Thereby, on the substrate K made of the plastic is formed the carbon thin film 22 excellent in the various physical properties such as the refractive index, the conductivity, the hardness, and the like, having the adherent film 21 therebetween.

<3. Physical Properties of the Carbon Thin Film>

Next, with reference to FIGS. 7 to 15, the physical properties of the carbon thin film 22 formed by the film deposition method according to the embodiment will be described in order.

<<3-1. Infrared Spectroscopic Property>>

Figure 7:
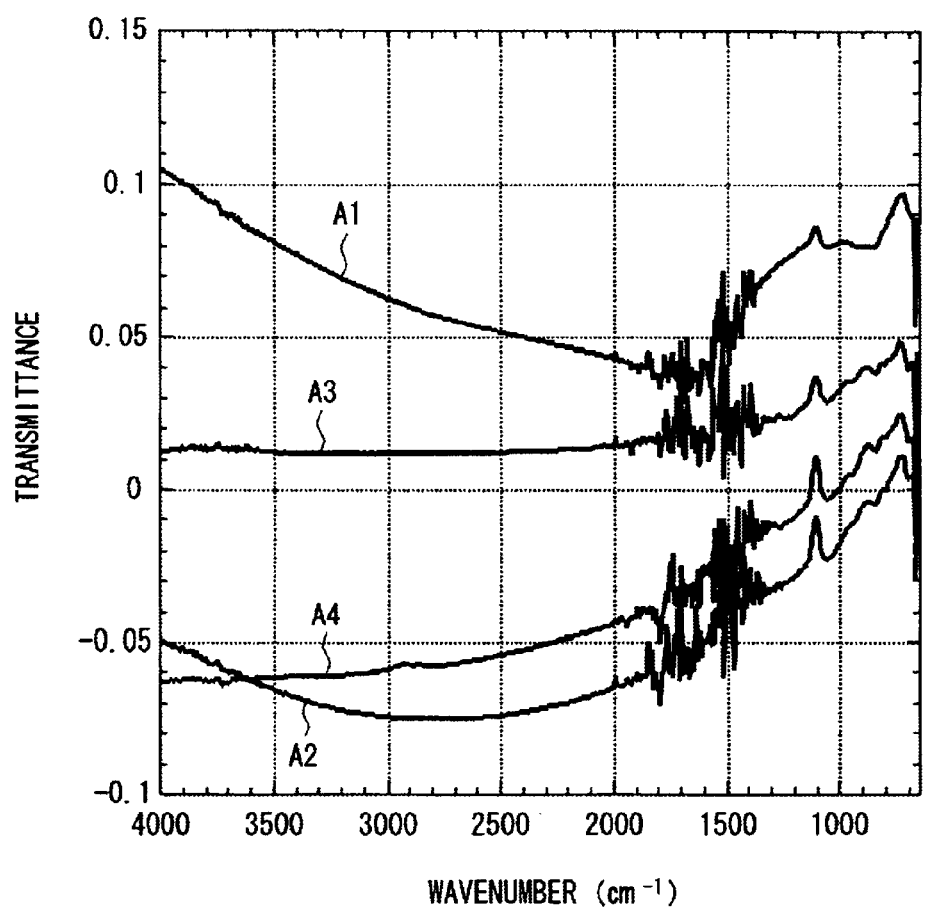
FIG. 7 is a view showing infrared spectroscopic properties of carbon thin films formed by the film deposition method according to the first embodiment of the invention.

FIG. 7 shows infrared spectroscopic properties of the carbon thin film 22 and the like, and the "horizontal axis" and the "vertical axis" in the figure represent wavenumber (cm$^{-1}$) and transmittance, respectively. Using the film deposition method according to the embodiment, the following samples were formed, transmittance property of each of the samples was measured by an infrared spectrometer, and the results shown in FIG. 7 were obtained: Carbon thin film sample A1 (the carbon thin film 22) formed using the pulsed voltage having a negative pulse peak value V1=−20 kV which is applied to the substrate K in the ion implantation process, Carbon thin film sample A2 formed using V=−10 kV, Carbon thin film sample A3 (the carbon precursor film 22Z) as a comparative example formed by the almost same film deposition method as that according to the embodiment except for eliminating the ion implantation process, and Carbon thin film sample A4 as another comparative example formed by an existing plasma CVD (Chemical Vapor Deposition). When forming Carbon thin film samples A1–A4, a material made of silicon was used as the substrate K. In addition, FIGS. 8 and 9 are enlarged views showing essential parts of the infrared spectroscopic properties data (wavenumber=700 cm$^{-1}$–1200 cm$^{-1}$) of Carbon thin film samples A1 and A4 shown in FIG. 7.

Figure 8:
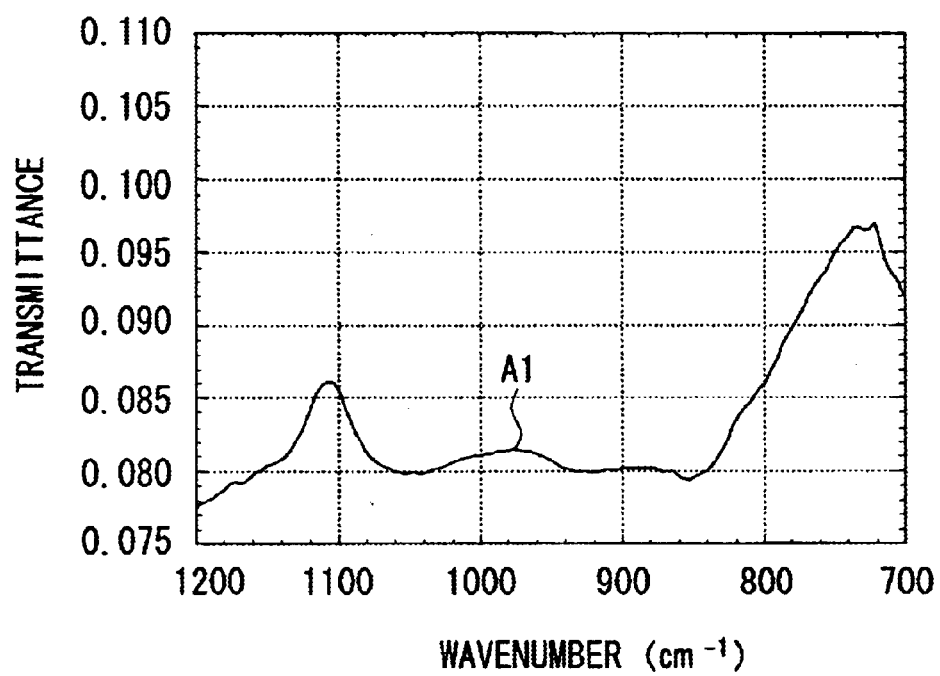
FIG. 8 is a view showing an enlarged essential part of data of the infrared spectroscopic properties shown in FIG. 7.
Figure 9:
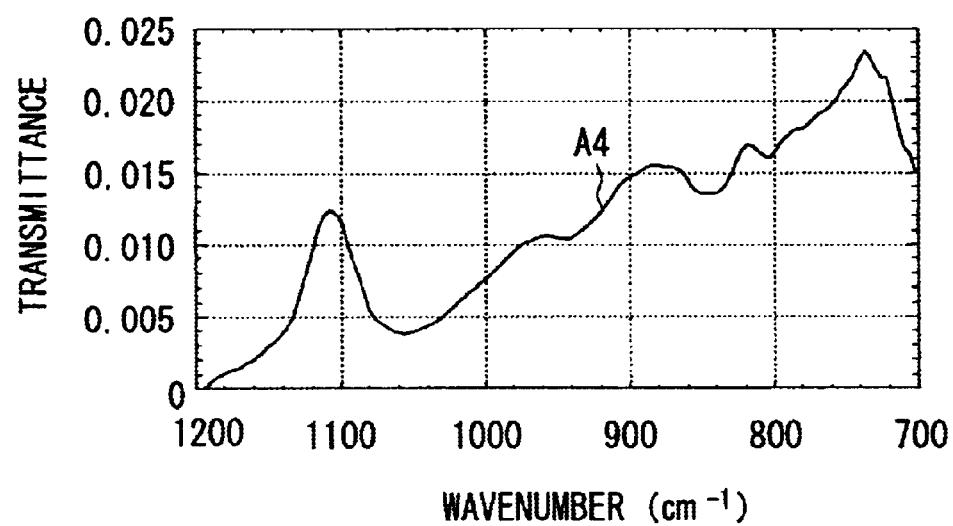
FIG. 9 is a view showing an enlarged essential part of data of the infrared spectroscopic properties shown in FIG. 7.

As shown in FIGS. 7 and 8, Carbon thin film sample A1 (the carbon thin film 22) exhibits a flat area at about 900 cm$^{-1}$–1000 cm$^{-1}$. On the other hand, Carbon thin film sample A4 as the comparative example, as shown in FIGS. 7 and 9, exhibits no flat area, and Carbon thin film sample A3 (the carbon precursor film 22Z) also exhibits the same trend. This provides verification that the carbon thin film 22 was obtained by improving the quality of the carbon precursor film 22Z via the ion implantation process (the negative pulse peak value V1=−20 kV) using the PBII. In addition, Carbon thin film sample A2 (the negative pulse peak value V1=−10 kV) exhibited no flat area, but studies on the negative pulse peak value V1 revealed that a flat area began to appear at V1=about 15 kV. As a reason why the quality of the carbon precursor film 22Z is improved at the negative pulse peak value V1 of about 15 kV or less, it is assumed that the above pulse peak value is equivalent to a threshold of breaking $SP^3$ bonds in the carbon precursor film 22Z.

<<3-2. Electric Resistance Property>>

Figure 10:
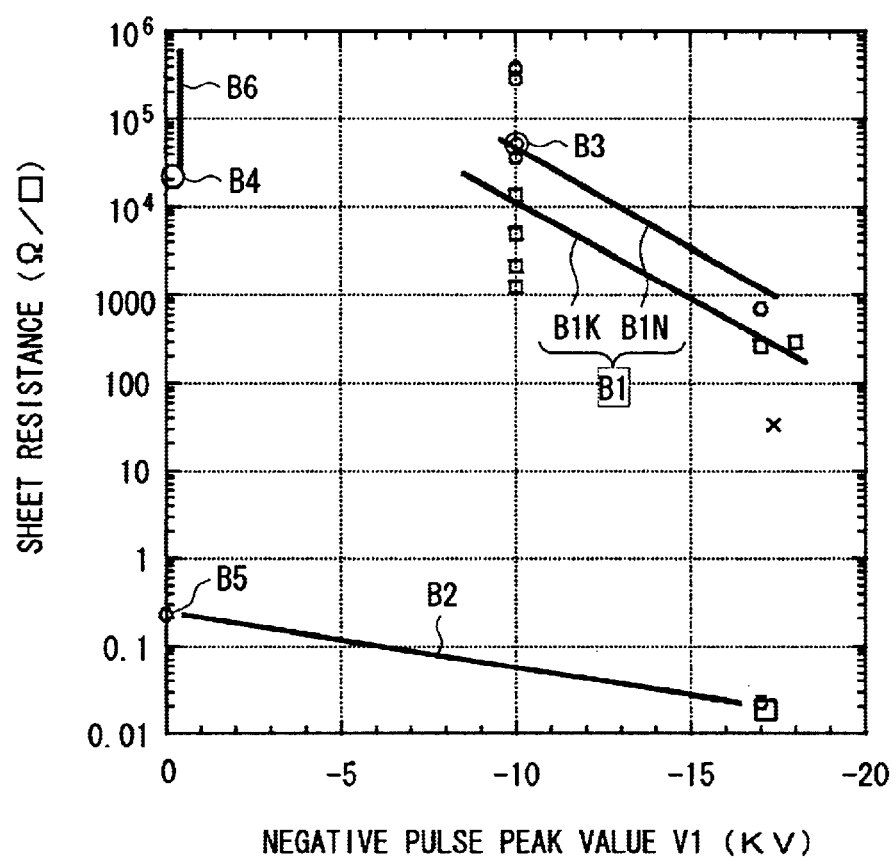
FIG. 10 is a view showing an electric resistance property of carbon thin films formed by the film deposition method according to the first embodiment of the invention.

FIG. 10 shows electric resistance property of the carbon thin film 22, and the "horizontal axis" and the "vertical axis" in the figure represent the negative pulse peak values V1 (kV) of the pulsed voltage being applied to the substrate K in the ion implantation process and sheet resistance ($\Omega/\square$), respectively. The following samples were formed using the film deposition method according to the embodiment, sheet resistances of each of the samples was measured with a four-terminal ohmmeter, and the results shown in FIG. 10 were obtained: Carbon thin film sample B1 (the carbon thin film 22; V1=about −18 kV to −8 kV) formed using the substrate K (about 5 $\Omega$cm) made of silicon, Carbon thin film sample B2 (V1=about−16 kV to −1 kV) formed using the substrate K (about 23 m$\Omega/\square$) made of AlTiC ($Al_2O_3 \cdot TiC$), Carbon thin film sample B3 (V1=about−10 kV) formed using the substrate K made of glass (for example, Coarning 7059 (brand name) manufactured by Dow Corning), Carbon thin film sample B4 (the carbon precursor film 22Z) as a comparative example formed by the almost same film deposition method as that according to the embodiment except for eliminating the ion implantation process, Carbon thin film sample B5 as another comparative example formed by the almost same film deposition method as that according to the embodiment except for performing the film deposition process in the atmospheric pressure environment and eliminating the ion implantation process, and Carbon thin film sample B6 as another comparative example formed using the substrate K made of silicon and the existing plasma CVD (Chemical Vapor Deposition). In addition, "○", "□", and "X" shown in FIG. 10 represent formation thickness of Carbon thin film samples B1–B4, and "○", "□" and "X" represent about 40 nm–50 nm, about 90 nm–100 nm, and about 400 nm, respectively. B1N represents a resistance change of Carbon thin film sample B1 with a formation thickness of about 40 nm–50 nm and B1K represents a resistance change of Carbon thin film sample B with a formation thickness of 90 nm–100 nm.

As shown in FIG. 10, the sheet resistance of Carbon thin film sample B4 (the carbon precursor film 22Z) was comparatively high and was about $10^4$ $\Omega/\square$. Moreover, the sheet resistance of Carbon thin film sample B6 formed by the existing plasma CVD was about $10^5$ $\Omega/\square$ or more. On the other hand, Carbon thin film sample B1 (the carbon thin film 22) provided the almost same sheet resistance (about $10^4$ $\Omega/\square$) around the negative pulse peak value V1=about −10 kV as Carbon thin film sample B4 (the carbon precursor film 22Z), but the sheet resistance was decreased rapidly to about $10^3$ $\Omega/\square$ or less when V1 was about −15 kV or less. The downward tendency of the sheet resistance was similarly observed when changing the formation thickness of Carbon thin film sample B1 (the carbon thin film 22) within a range of about 40 nm–400 nm. This provides verification that the carbon thin film 22 obtained by the ion implantation process using the PBII had the sheet resistance notably smaller than that of the carbon precursor film 22Z, and the excellent conductivity. Moreover, the variation range of the sheet resistance in Carbon thin film sample B2 became smaller than the variation range of the sheet resistance in Carbon thin film sample B1, which provides verification that the sheet resistance of the whole sample structure including the carbon thin film 22 and the substrate K depended on the magnitude of the resistance of the substrate K itself.

Figure 11:
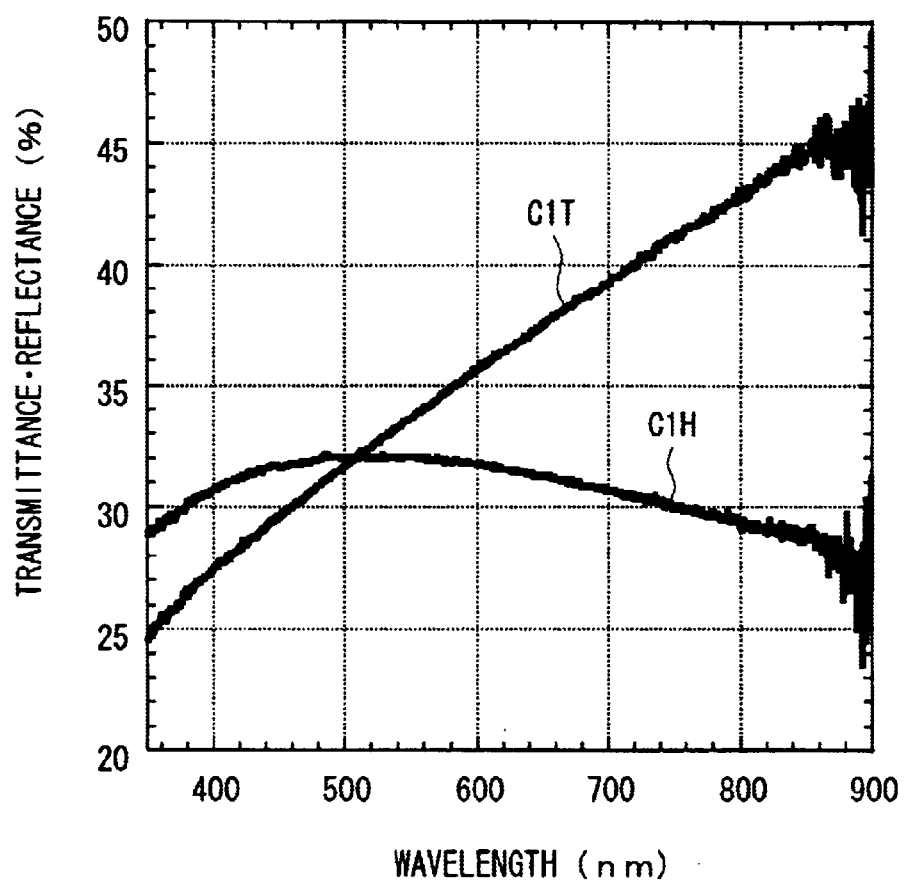
FIG. 11 is a view showing visible spectral property of a carbon thin film formed by the film deposition method according to the first embodiment of the invention.
Figure 12:
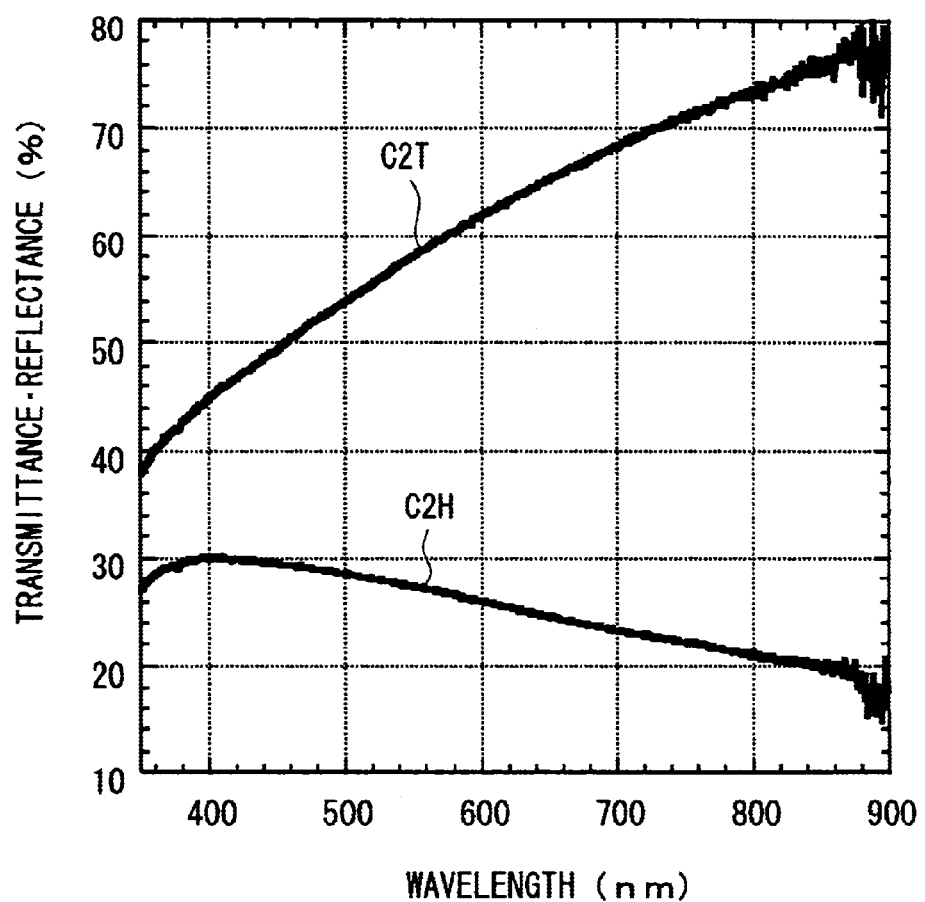
FIG. 12 is a view showing visible spectral property of a carbon thin film as a comparative example of the visible spectral property of the carbon thin films shown in FIG. 11.

<<3-3. Visible Spectral Property>>FIGS. 11 and 12 show visible spectral properties of the carbon thin film 22 and the like. FIGS. 11 and 12 show the spectral properties of Carbon thin film sample C1 (the carbon thin film 22) formed by the film deposition method according to the embodiment and Carbon thin film sample C2 (the carbon precursor film 22Z) as a comparative example formed by the almost same film deposition method as that according to the embodiment except for eliminating the ion implantation process, respectively. The "horizontal axis" and the "vertical axis" in the figures represent respectively wavelengths (nm), and transmittance and reflectance (%). For forming Carbon thin film sample C1, film deposition time for the second film deposition process was set to about 5 minutes, the formation thickness of the carbon precursor film 22Z was set to about 20 nm–25 nm, and injection time for the ion implantation process was set to about 1.6 minutes. Moreover, for forming the carbon thin film sample C2, the thickness of the carbon precursor film 22Z was set to about 36 nm, for example. The spectral properties of both Carbon thin film samples C1 and C2 were measured with a spectrophotometer, and results shown in FIGS. 11 and 12 were obtained. In addition, "C1T" and "C1H" in FIG. 11 represent respectively transmittance property and reflection property of Carbon thin film sample C1, and "C2T" and "C2H" in FIG. 12 represent respectively transmittance property and reflection property of Carbon thin film sample C2.

As shown in FIGS. 11 and 12, while the reflectance of Carbon thin film sample C1 (C1H; the carbon thin film 22) and Carbon thin film sample C2 (C2H; the carbon precursor film 22Z) were the almost equivalent, the transmittance of Carbon thin film sample C1 (C1T) decreased more notably than Carbon thin film sample C2 (C2T). Absorption coefficients k of both Carbon thin film samples C1 and C2 were calculated based on these results, that of Carbon thin film sample C2 was k=about 0.136, and that of Carbon thin film sample C1 was larger, k=0.3. This provides verification that decreasing the $SP^3$ bond components via the ion implantation process using the PBII and simultaneously increasing $SP^2$ bond components softened the film quality of the carbon thin film 22 and changed the refractive index of the carbon thin film 22.

<<3-4. Hardness Property>>

Figure 13:
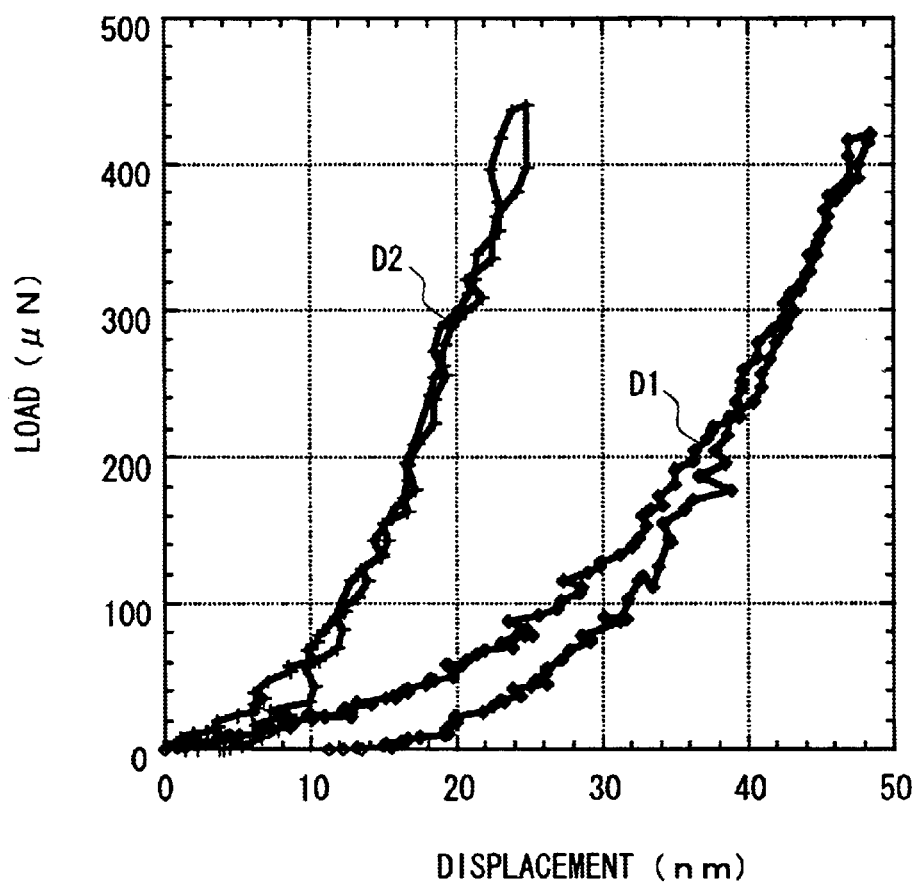
FIG. 13 is a view showing hardness property of a carbon thin film formed by the film deposition method according to the first embodiment of the invention.

FIG. 13 shows hardness property of the carbon thin film 22, and the "horizontal axis" and the "vertical axis" in the figure represent respectively displacement (nm) and load ($\mu$N). Nanoindentation tests were performed respectively on Carbon thin film sample D1 (the carbon thin film 22) formed by the film deposition method according to the embodiment and Carbon thin film sample D2 (the carbon precursor film 22Z) as a comparative example formed by the almost same film deposition method as that according to the embodiment except for eliminating the ion implantation process, and results shown in FIG. 13 were obtained. Both of Carbon thin film samples D1 and D2 were formed to a thickness of about 100 nm.

As shown in FIG. 13, the displacement versus the load condition of Carbon thin film sample D1 (the carbon thin film 22) is larger than that of Carbon thin film sample D2 (the carbon precursor film 22Z). This provides verification that Young's modulus of the carbon thin film 22 was more decreased than that of the carbon precursor film 22Z because of increasing the $SP^2$ bond components via the ion implantation process using the PBII.

<<3-5. Scratch Property>>

Figure 14:
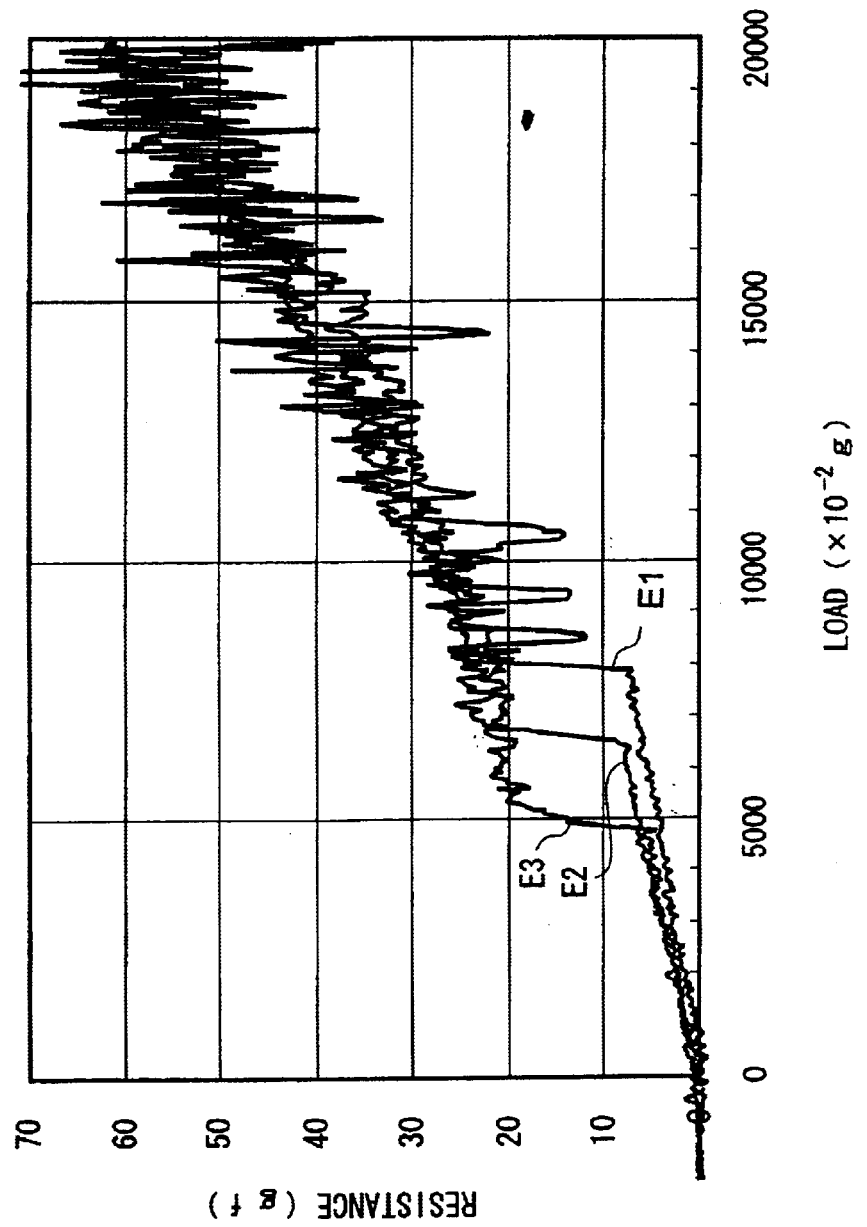
FIG. 14 is a view showing scratch property of a carbon thin film formed by the film deposition method according to the first embodiment of the invention.

FIG. 14 shows scratch property of the carbon thin film 22, and the "horizontal axis" and the "vertical axis" in the figure represent respectively load ($\times 10^{-2}$ g) and resistance (gf). Scratch tests were performed on Carbon thin film sample E1 (the carbon thin film 22) formed by the film deposition method according to the embodiment, Carbon thin film sample E2 (the carbon precursor film 22Z) as a comparative example formed by the almost same film deposition method as that according to the embodiment except for eliminating the ion implantation process, and Carbon thin film sample E3 as another comparative example formed by the almost same film deposition method as that according to the embodiment except for eliminating the ion implantation process nor the first film deposition process (the formation of the adherent film 21), and results shown in FIG. 14 were obtained. In addition, for forming Carbon thin film samples E1–E3, a material made of silicon was used as the substrate K.

As shown in FIG. 14, loads for peeling Carbon thin film samples E1 (the carbon thin film 22), E2 (the carbon precursor film 22Z), and E3 from the substrate K were respectively about 80 g, about 63 g, and about 47 g. Therefore, the difference between the loads for peeling Carbon thin film samples E2 and E3 provides verification that the bonding force of the carbon thin film 22 to the substrate K was increased because of the existence of the adherent film 21, and the difference between the loads for peeling Carbon thin film samples E1 and E2 provides verification that the bonding force of the carbon thin film 22 was further increased because of the ion implantation process using the PBII.

Figure 15:
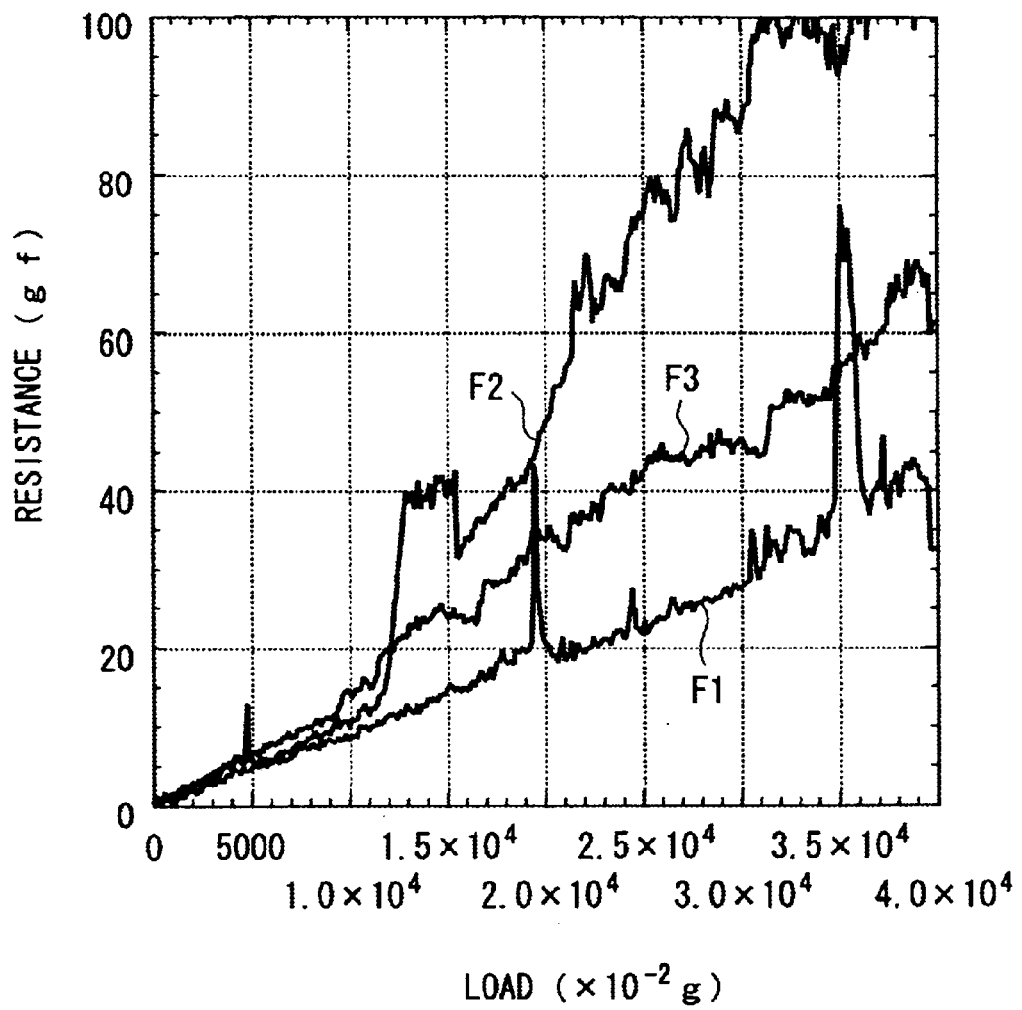
FIG. 15 is a view showing another scratch property of a carbon thin film formed by the film deposition method according to the first embodiment of the invention.

Also, improvements in the adhesion of the above carbon thin film 22 were similarly confirmed, when the substrate K made of AlTiC was used instead of silicon. FIG. 15 shows another scratch property of the carbon thin film 22. Compositions, formation procedures and the like of Carbon thin film samples F1, F2, and F3 shown in the figure are respectively the same as those of Carbon thin film samples E1, E2, and E3 shown in FIG. 14 except for the point of using the substrate K made of AlTiC.

As shown in FIG. 15, the loads for peeling Carbon thin film samples F1, F2, and F3 from the substrate K were respectively about 336 g, about 127 g, and about 91 g. This provides verification that using the substrate K made of AlTiC further increased the bonding force of the carbon thin film 22 to the substrate K compared with the case of using the substrate K made of silicon.

<4. Actions and Effects>

As described above, in the film deposition method according to the embodiment, the carbon thin film 22 is formed by implanting the carbon ions N2B in the carbon precursor film 22Z with applying the pulsed voltage containing the negative pulse voltage to the substrate K, after forming the carbon precursor film 22Z on the surface of the substrate K with the carbon ions N2A using the processing source 4 (the FCVA ion source) with no voltage applied to the substrate K. Therefore, the quality of the carbon precursor film 22Z is improved, which allows the control of the various physical properties of the carbon thin film 22 such as the electric resistance properties, the hardness properties, the scratch properties, and the like. This allows the carbon thin film 22 which has high quality and is excellent in the various physical properties to be formed.

Particularly, in the ion implantation process according to this embodiment, the pulsed voltage containing the negative pulse voltage of −15 kV or less is applied to the substrate K, so the carbon ions N2B are easily drawn into the carbon precursor film 22Z, which can surely perform the ion implantation process on the carbon precursor film 22Z. Therefore, the various physical properties of the carbon thin film 22 can properly be controlled.

Moreover, in this embodiment, the carbon thin film 22 is formed by the processing source 4 (the FCVA ion source), so the carbon thin film 22 can be stably formed on the surface of the substrate K made of the plastic based on the following reasons. Namely, for example, if existing semiconductor processes are used for forming the carbon thin film 22, a processing temperature is comparatively high (more than about 400° C.). So, materials of the substrate K is limited to materials having resistance properties to such a high temperature condition, such as metals having a comparatively high melting point of about 400° C. or over. In such a case, if a plastic having a comparatively low melting point (or a softening point) of about 100° C. or below is used as the material of the substrate K, the substrate K may be deformed or damaged due to the high temperature. So the conventional semiconductor processes cannot be used as the formation procedure for forming the carbon thin film 22 on the surface of the substrate K made of the plastic. On the other hand, in this embodiment, the carbon thin film 22 is formed by the processing source 4 at a comparatively low processing temperature (about 100° C. or below), so the substrate K is not exposed to the temperature environments higher than the melting points of the plastics unlike the case of using the semiconductor processes, and the temperature of the substrate K itself is also maintained at about 100° C. or below. Therefore, selecting a material of the substrate K is not affected by the processing temperature, and it is possible to form the carbon thin film 22 on the surface of the substrate K without generating problems such as deformations and damages, even when the plastics are used as the composition material of the substrate K.

Moreover, in this embodiment, the adherent film 21 is formed between the substrate K and the carbon thin film 22, so the existence of the adherent film 21 increases the bonding force of the carbon thin film 22 to the substrate K, and obviously from the results of the scratch properties shown in FIGS. 14 and 15, the carbon thin film 22 having the excellent physical strength can be formed.

<Modification>

In addition, the insulating materials such as the plastics, but not necessarily limited to these, are used for composing the substrate K in this embodiment, and materials made of a conductive material such as a metal and a semiconductor may be used. Also in these cases, the carbon thin film 22 can be formed in the comparatively low processing environments (about 100° C. or below). In addition, when using the substrate K made of the conductive material, only the negative pulse voltage may be applied to the substrate K by the pulse power supply 7.

[Second Embodiment]

Next, a film deposition method according to a second embodiment of the invention will be described.

Figure 16:
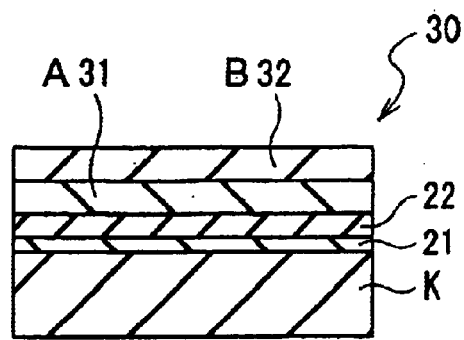
FIG. 16 is a view showing an example of configuration of an optical device produced by a film deposition method according to a second embodiment of the invention.
Figure 17:
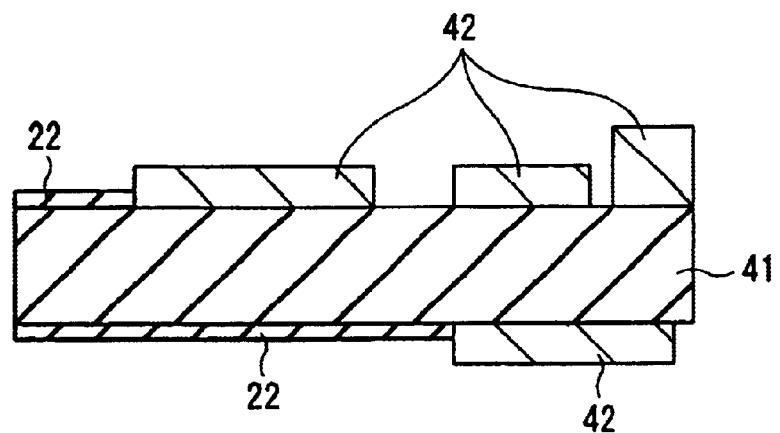
FIG. 17 is a view showing an example of using a heat conduction device produced by the film deposition method according to the second embodiment of the invention.

The film deposition method according to the embodiment is to use the carbon thin film 22, which is formed in the above first embodiment, for various devices. Examples of using the carbon thin film 22 to compose the various devices according to the film deposition method of the embodiment will be described below with reference to FIGS. 16 and 17. In addition, explanations about the formation processes of the carbon thin film 22 and the like will be eliminated below. In FIGS. 16 and 17, the same parts as the components described in the above first embodiment will be denoted by the same signs.

FIG. 16 shows an example of using the carbon thin film 22 as one component of an optical device. The optical device 30 is an optical multilayer film comprising the carbon thin film 22 which is formed on the substrate K with the adherent film 21 therebetween by the film deposition method described in the above first embodiment, an optical thin film A31 which is disposed on the carbon thin film 22 and made of silicon dioxide ($SiO_2$) or the like, and an optical thin film B32 which is disposed on the optical thin film A31 and made of zirconium dioxide ($ZrO_2$). In addition, as described in the above first embodiment, materials made of a plastic, silicon, or glass or the like can be used as the substrate K. In the optical device 30, for example, optical properties thereof can be controlled by controlling the refractive index and the absorption coefficient of the carbon thin film 22 so that the optical device 30, which is the optical multilayer film comprising the carbon thin film 22, the optical thin film A31, and the optical thin film B32, may have desired optical properties (for example, the refractive index n=2.5, the absorption coefficient k=0.2).

FIG. 17 shows an example of using the carbon thin film 22 as a heat conduction device based on heat absorption properties of the carbon thin film 22. The heat conduction device is selectively disposed to cover surfaces except for a disposing region where various elements 42 such as a transistor and a condenser are disposed on both sides of a printed circuit board 41, and the thickness thereof is set to be between 40 nm and 10 $\mu$m. For example, heat generated by the elements 42 is absorbed by the carbon thin film 22 directly or through the printed circuit board 41, and the rise in temperature of the elements 42 due to the heat generation is inhibited. That is, the carbon thin film 22 functions as the heat conduction device.

The various devices, which is composed by the film deposition method according to the embodiment using the carbon thin film 22, comprise the carbon thin film 22 formed in the above first embodiment as a component thereof, so the same actions as those of the above first embodiment can provide the high quality various devices excellent in various physical properties.

<Modification>

The cases where the carbon thin film 22 is used for the optical device and the heat conduction device are described in this embodiment, but necessarily limited to these cases, and it can also be used for other various devices. For example, the carbon thin film 22 is used as an EMC (Electro Magnetic Compatibility) device, which is an example of "other various devices", based on propagation absorption properties of the carbon thin film 22, and the EMC device may be mounted in a housing of cellular phones. The existence of the EMC device prevents unnecessary electromagnetic waves from reaching central sections (for example, CPU and the like) of the cellular phones, which can inhibit occurrences of problems such as malfunctions, failures, and the like of the cellular phones resulting from the influences of the electromagnetic waves. Such an EMC device can also be applied to various electric devices as well as the cellular phones to inhibit the occurrences of the above malfunctions, the failure, and the like.

Other actions, effects, modifications, and the like in addition to those described above according to the embodiment are the same as those of the above first embodiment.

Although the invention has been described by the foregoing embodiments, the invention is not limited to the embodiments but can be variously modified. For example, the film deposition method described in the above first embodiment is not necessarily limited to ones described in both the above embodiments, and can be varied at will, as long as the carbon thin film 22 can be formed by implanting the carbon ions N2B in the carbon precursor film 22Z with the pulsed voltage containing the negative pulse voltage of −15 kV or less which is applied to the substrate K, after forming the carbon precursor film 22Z on the surface of the substrate K with the carbon ions N2A with no voltage applied to the substrate K using the FCVA ion source.

Moreover, the above second embodiment has described the cases where the carbon thin film 22 described in the above first embodiment is used for the various devices, but the invention is not necessarily limited to these, and the carbon thin film 22 may be also utilized for other applications as well as the components of the various devices. Other applications of the carbon thin film 22 can include examples of using it as a protection material of various electronic components and the like, from the aspect of the excellent scratch properties thereof, for example. Specifically, covering a surface of a head section in magnetic recording heads (HDD (Hard Disk Drive), video head, and the like.) and optical recording heads with the carbon thin film 22 can inhibit the head section from wearing when it touches a recording media such as disks or tapes.

As described above, according to the film deposition method of the invention, the first carbon ions are generated with no voltage applied to the processing object, the carbon precursor film is formed on the surface of the processing object with the first carbon ions, and then the second carbon ions, which are generated with the pulsed voltage containing the negative pulse voltage which is applied to the processing object, are implanted in the carbon precursor film to form the carbon thin film, wherein both of the first carbon ions and the second carbon ions are generated by evaporating the cathode containing carbon using the energy of the arc discharges. This improves the quality of the carbon precursor film and allows the control of the various physical properties of the carbon thin film. Thereby, the high quality carbon thin film excellent in the various physical properties can be formed.

Particularly, the pulsed voltage containing the negative pulse voltage of −15 kV or less is applied to the processing object according to one aspect of the film deposition method of the invention, so the second carbon ions are easily drawn in the carbon precursor film, which allows the ion implantation process to be surely performed on the carbon precursor film. Therefore, the various physical properties of the carbon thin film can properly be controlled.

Moreover, it is intended to use the materials made of a plastic as the processing object according to one aspect of the film deposition method of the invention, so the carbon thin film can be formed on the surface of the processing object made of the plastic without generating the problems such as the deformations and the damages during forming the film, even when the processing object made of a plastic with a comparatively low melting point is used.

Furthermore, the pulsed voltage containing the positive pulse voltage and the negative pulse voltage is applied to the processing object according to one aspect of the film deposition method of the invention, which prevents charge remaining (charge up) inside the processing object during the film deposition. Therefore, plateau phenomenon of the ion implantation process resulting from the charge up can be avoided, and the ions can be implanted in the processing object smoothly and uniformly.

In addition, the object with the adherent layer is used as the processing object according to one aspect of the film deposition method of the invention, so the existence of the adherent layer increased the bonding power of the carbon thin film to the processing object, and the carbon thin film having the excellent physical strength can be formed.

Obviously many modifications and variations of the present invention are possible in the light of the above teachings. It is therefore to be understood that within the scope of the appended claims the invention may be practiced otherwise than as specifically described.

What is claimed is:

1. A film deposition method for forming a carbon thin film on a surface of a processing object, comprising:
   a first step of generating first carbon ions and forming a carbon precursor film on the surface of the processing object with the first carbon ions, with no voltage applied to the processing object; and
   a second step of generating second carbon ions and implanting the second carbon ions in the carbon precursor film, with a pulsed voltage containing a negative pulse voltage applied to the processing object,
   wherein both of the first carbon ions and the second carbon ions are generated by evaporating a cathode containing carbon using energy of arc discharges.

2. A film deposition method according to claim 1, wherein the pulsed voltage containing at least the negative pulse voltage of −15 kV or less is applied to the processing object in the second step.

3. A film deposition method according to claim 1, wherein the first step and the second step are repeated two or more times to laminate the carbon thin film.

4. A film deposition method according to claim 1, wherein an insulator is used as the processing object.

5. A film deposition method according to claim 4, wherein an insulator made of a plastic is used as the processing object.

6. A film deposition method according to claim 5, wherein the pulsed voltage containing a positive pulse voltage and the negative pulse voltage is applied to the processing object in the second step.

7. A film deposition method according to claim 1, wherein an adherent layer for bonding the carbon precursor film to the processing object is located on the processing object.

8. A film deposition method according to claim 7, wherein the adherent layer includes amorphous silicon.

* * * * *